(12) United States Patent
Bertram et al.

(10) Patent No.: US 9,541,274 B2
(45) Date of Patent: Jan. 10, 2017

(54) ILLUMINATION MODULE AND ILLUMINATION DEVICE COMPRISING A FLEXIBLE CARRIER

(75) Inventors: Ralph Bertram, Nittendorf (DE); Tobias Frost, Burglengenfeld (DE); Christian Herbold, Karlsruhe (DE); Steffen Strauss, Regensburg (DE)

(73) Assignee: OSRAM GmbH, Munich (DE)

( * ) Notice: Subject to any disclaimer, the term of this patent is extended or adjusted under 35 U.S.C. 154(b) by 237 days.

(21) Appl. No.: 13/322,579

(22) PCT Filed: May 11, 2010

(86) PCT No.: PCT/EP2010/056499
§ 371 (c)(1),
(2), (4) Date: Nov. 28, 2011

(87) PCT Pub. No.: WO2010/136333
PCT Pub. Date: Dec. 2, 2010

(65) Prior Publication Data
US 2012/0069556 A1    Mar. 22, 2012

(30) Foreign Application Priority Data
May 28, 2009  (DE) .......... 10 2009 023 052

(51) Int. Cl.
*F21V 21/00*    (2006.01)
*F21V 29/70*    (2015.01)
(Continued)

(52) U.S. Cl.
CPC ............... *F21V 29/70* (2015.01); *F21S 4/003* (2013.01); *F21S 4/20* (2016.01); *F21V 7/005* (2013.01);
(Continued)

(58) Field of Classification Search
CPC ........... F21Y 2103/003; F21Y 2101/02; F21V 19/009; F21V 29/004; F21V 29/74; F21V 29/20; F21V 29/506; F21V 23/03; F21V 3/0428; F21V 3/0436; F21V 7/005; F21V 7/22; F21S 4/20; H05K 1/209; H05K 2201/09018; H05K 2201/09036; H05K 2201/10106
(Continued)

(56) References Cited

U.S. PATENT DOCUMENTS 5,519,596 A * 5/1996 Woolverton .......... F21S 48/215
257/E25.028
6,299,337 B1 * 10/2001 Bachl .................. F21S 48/215
257/E25.028
(Continued)

FOREIGN PATENT DOCUMENTS

CN          2804578 Y       8/2006
CN          101122368 A     2/2008
(Continued)

OTHER PUBLICATIONS

English abstract of EP 1813857 A1.
(Continued)

*Primary Examiner* — Bryon T Gyllstrom
*Assistant Examiner* — Robert May
(74) *Attorney, Agent, or Firm* — Viering, Jentschura & Partner mbB

(57) ABSTRACT

An illumination module may include at least one flexible carrier for a plurality of heat sources, including light sources, wherein the carrier is provided for being bent over at least part of its width.

12 Claims, 12 Drawing Sheets

(51) Int. Cl.
*F21S 4/00* (2016.01)
*F21V 23/02* (2006.01)
*F21V 29/00* (2015.01)
*F21V 7/00* (2006.01)
*F21V 29/74* (2015.01)
*H05K 1/18* (2006.01)
*F21V 3/04* (2006.01)
*F21V 7/22* (2006.01)
*F21V 29/506* (2015.01)
*F21Y 101/00* (2016.01)

(52) U.S. Cl.
CPC .............. *F21V 23/02* (2013.01); *F21V 29/004* (2013.01); *F21V 29/74* (2015.01); *F21V 3/0418* (2013.01); *F21V 3/0436* (2013.01); *F21V 7/22* (2013.01); *F21V 29/20* (2013.01); *F21V 29/506* (2015.01); *F21Y 2101/00* (2013.01); *F21Y 2103/10* (2016.08); *F21Y 2115/10* (2016.08); *H05K 1/189* (2013.01); *H05K 2201/09018* (2013.01); *H05K 2201/09036* (2013.01); *H05K 2201/0999* (2013.01); *H05K 2201/10106* (2013.01)

(58) Field of Classification Search
USPC ........ 362/217.14, 555, 217.01–225, 294, 373
See application file for complete search history.

(56) References Cited

U.S. PATENT DOCUMENTS

| | | | |
|---|---|---|---|
| 6,582,103 B1 | 6/2003 | Popovich et al. | |
| 6,659,623 B2* | 12/2003 | Friend | 362/249.06 |
| 7,306,353 B2* | 12/2007 | Popovich et al. | 362/373 |
| 7,500,771 B2* | 3/2009 | Schmierer | B60Q 1/2665 362/487 |
| 7,690,813 B2 | 4/2010 | Kanamori et al. | |
| 7,918,580 B2* | 4/2011 | Liu | 362/218 |
| 7,934,856 B2* | 5/2011 | Sanpei et al. | 362/294 |
| 7,939,837 B2* | 5/2011 | Lynch | F21K 9/00 257/88 |
| 8,075,158 B2* | 12/2011 | Amoraga Rodriguez | F21K 9/17 362/249.02 |
| 2004/0001344 A1 | 1/2004 | Hecht | |
| 2004/0012959 A1 | 1/2004 | Robertson et al. | |
| 2005/0024866 A1* | 2/2005 | Homan | 362/219 |
| 2006/0082315 A1* | 4/2006 | Chan | F21K 9/00 315/46 |
| 2007/0183147 A1* | 8/2007 | Herlands | 362/217 |
| 2009/0086488 A1* | 4/2009 | Lynch et al. | 362/249.02 |
| 2009/0140271 A1* | 6/2009 | Sah | F21K 9/00 257/88 |
| 2009/0237922 A1* | 9/2009 | Chiu | 362/223 |
| 2010/0328947 A1* | 12/2010 | Chang | F21V 19/0045 362/249.02 |

FOREIGN PATENT DOCUMENTS

| | | |
|---|---|---|
| DE | 29603557 U1 | 4/1996 |
| DE | 20008944 U1 | 1/2001 |
| DE | 102006019857 A1 | 11/2006 |
| EP | 1163471 B1 | 12/2001 |
| EP | 1657488 A2 | 5/2006 |
| EP | 1813857 A1 | 8/2007 |
| WO | 2005090852 A2 | 9/2005 |

OTHER PUBLICATIONS

English abstract for CN2804578Y dated Aug. 9, 2006.
English abstract for EP1163471 A1 dated Dec. 19, 2001.
Office Action issued for German patent application 102009023052.1 on May 26, 2014.
European Office Action based on Application No. 10 721 762.2(4 Pages) dated Jan. 24, 2016 (Reference Purpose Only).

* cited by examiner

ILLUMINATION MODULE AND ILLUMINATION DEVICE COMPRISING A FLEXIBLE CARRIER

RELATED APPLICATIONS

The present application is a national stage entry according to 35 U.S.C. §371 of PCT application No. PCT/EP2010/056499 filed on May 11, 2010, which claims priority from German application No. 10 2009 023 052.1 filed on May 28, 2009.

TECHNICAL FIELD

Various embodiments relate to an illumination module having at least one flexible tape-type carrier for a plurality of heat sources, and to an illumination device having at least one illumination module.

BACKGROUND

Heat-generating electronic components, e.g. light-emitting diodes, have to be thermally linked to heat-dissipating components (heat sinks, housings, etc.). In the case of curved housing or heat sink forms, a standard circuit carrier such as an FR4 or metal-core circuit board cannot be directly linked. In that case, it is possible to use a lateral thermal linkage of the metal-core circuit board, but this causes poor heat dissipation, or it is possible to use specific extruded profiles or a heat sink geometry having planar areas or planar milled-out portions, which means a high outlay in terms of production and mounting, e.g. mounting using screws or clamping connections.

Furthermore, tapes which are equipped with light-emitting diodes and are flexible in their longitudinal direction (LED flex tapes) are known. Thus, by way of example, the LINEARlight Flex series from Osram is known, in which an LED tape wound up on a roll is obtainable (e.g. in the LM1X series), wherein the overall module has 120 to 600 LEDs, depending on the embodiment. The basic dimensioning of the smallest unit having 10 LEDs (L×W) is 140 mm×10 mm. A minimum bending radius of the LED tape is 2 cm. The LED tape has a self-adhesive rear side. However, areal mounting of the LED flexible tape on a support curved with respect to its width or transverse extent is not provided.

SUMMARY

Various embodiments provide a possibility for simpler fixing and improved heat dissipation of an illumination module even on a support that is curved with respect to its width extent.

Various embodiments provide an illumination module, having at least one flexible carrier for a plurality of light sources, wherein the carrier is provided for being bent or deformable over at least part of its width. The illumination module can therefore be provided for being bent at least in sections transversely with respect to its longitudinal extent.

The carrier can be present in the form of a circuit carrier or a printed circuit board.

In addition to the light sources, even further electronic components, in particular other heat sources, can also be arranged on the carrier, preferably in a row with the light sources. A possible further configuration of a heat source can be an electronic component such as a driver unit or a resistor.

In accordance with one development, the carrier can be a tape-type carrier. In this case, the carrier can be a narrow carrier, that is to say that its longitudinal extent, which can be determined in particular by an alignment of the light sources, is larger than its transverse extent or width. Alternatively, the carrier can be a wide carrier, that is to say that its longitudinal extent is shorter than its transverse extent or width.

The light sources can include semiconductor light sources and/or other types of light sources. At least one semiconductor light source can have at least one diode laser and/or at least one light-emitting diode. The light-emitting diode can emit in a single color or in a multicolored fashion, e.g. white. In the case where a plurality of light-emitting diodes are present, the latter can emit light e.g. in the same color (light in a single color or in a multicolored fashion) and/or in different colors. Thus, an LED group may have a plurality of LED chips ("LED cluster") which together can produce a white mixed light, e.g. in "cold white" or "warm white". In order to generate a white mixed light, the LED cluster preferably has LED chips which emit light in the primary colors red (R), green (G) and blue (B). In this case, one or a plurality of colors, in particular green and red, can also be generated by phosphor conversion of a typically blue LED. In this case, individual or a plurality of colors can also be generated simultaneously by a plurality of LEDs; combinations RGB, RRGB, RGGB, RGBB, RGGBB, etc. are thus possible. However, the color combination is not restricted to R, G and B. It is also possible to use more than three colors; by way of example, combinations of R, G, B with (phosphor-converted) white (W) and also yellow (Y) LEDs are advantageous in order to generate high color renderings. Advantageously particularly for generating a warm-white hue, by way of example, there can also be present fewer than three colors, that is to say one or a plurality of red or yellow LEDs and/or phosphor-converted LEDs, in particular in white (W) or mint-green (M). In the case of LEDs with different colors, these can also be driven such that the LED group emits in a tunable RGB color range. In order to generate a white light from a mixture of blue light with yellow light, it is also possible to use LED chips provided with a phosphor, e.g. using surface mounting technology, e.g. using so-called chip level conversion technology. It is also possible to use other methods, such as a red/green combination by means of the conversion technology. A "traditional" volume conversion is also possible. An LED group can also have a plurality of white individual chips, as a result of which a simple scalability of the luminous flux can be achieved. The individual LEDs and/or the LED groups can be equipped with suitable optics for beam guiding, e.g. Fresnel lenses, collimators, and so on. Instead of or in addition to inorganic light-emitting diodes, e.g. based on InGaN or AlInGaP, organic LEDs (OLEDs) can generally also be used.

The carrier can be made flexible by virtue of the fact that it is produced from a flexible or compliant base material. The carrier can be provided for being bent once or a plurality of times. One possible base material can encompass, for example, polyester, FR4, PEN (polyethylene naphthalate) and/or PI (polyimide).

The carrier can additionally or alternatively be structured for attaining the flexibility or deformability. For this purpose, the carrier can have for example at least one thinned portion such as an expansion joint, to be precise on a top side and/or an underside of the carrier.

It can be the case in one configuration that the carrier is not provided for a bend at a strip running at least below the light sources, and is provided for a bend at at least one strip running laterally with respect to the light sources. It is thereby possible to prevent a fixing and/or a contact-connection of the light sources from being lost as a result of the bend and thus leading to a functional failure.

It is also possible in one configuration that the carrier has at least one heat spreading area at least on the at least one strip running laterally. As a result, the size of the heat spreading area can be increased and, consequently, a cooling of the heat sources of the illumination module can be improved. The heat spreading area can be formed by a material having good thermal conductivity, e.g. by a copper coating.

It is further possible in one configuration that at least part of the at least one heat spreading area is formed by at least one conductor track. By virtue of this dual functionality of the conductor track for electrical and thermal conduction, the illumination module can be produced less expensively since the material for separate conductor tracks can be saved. A form, a number and a course of the conductor tracks are not restricted and can encompass, for example, straight or curved, e.g. meandering, conductor tracks and/or conductor tracks that widen and taper again.

It is additionally possible in one configuration that the at least one strip provided for a bend has at least one bearing area. Heat dissipation from the carrier to a support on which the carrier bears can be greatly improved as a result.

The bearing area can have an adhesion layer, in particular composed of a thermally conductive adhesive, for the purpose of fixing on a support.

It is possible in yet another configuration that the illumination module has at least one expansion joint extending along a longitudinal direction of the carrier. As a result, flexibility of the carrier can be achieved and/or good definition of predetermined bending edges can be achieved. In one configuration, the at least one expansion joint can be situated at the boundary between the strip running below the light sources and a strip running laterally and can thus decouple the strip running laterally and the strip running below the light sources with respect to a bend. Thus, a bend of the strip running below the light sources and resultant detachment of the light sources or of the other electronic components or heat sources are prevented.

It is possible in another configuration that the illumination module has at least one reflector. Beam guiding can thereby be configured in a defined fashion.

It is then possible in one development that the reflector is present or configured as a reflective area of the carrier or as a separately produced reflector element placed onto the carrier. The reflective area can be formed for example by polishing the heat spreading area(s) to form a specularly reflective area, or by applying at least one reflective layer. The reflective area of the carrier can be present for example in the form of a metallic or dielectric mirror layer or a metallic and/or dielectric mirror layer composite assembly.

Furthermore, various embodiments provide a luminaire having a bent support and at least one illumination module of this type, wherein the illumination module is fixed areally to the support at least regionally by its part bent widthwise. In other words, the illumination module is connected to the support by a bearing area that is bent at least over part of its width. As a result, the illumination module can also be fixed to a support that is bent to a great extent in the width direction of the illumination module. This facilitates simple fixing without further aids, which, moreover, can be effected for example in a strongly adhesive fashion. Moreover, an optically advantageous geometrically conformal adaptation of the illumination module to the support is thus achieved.

It is possible in one configuration that the support is embodied in the form of a tube and the at least one illumination module is arranged longitudinally in the tube such that the at least one illumination module is at least partly fitted to a curved inner side of the tube. As a result, the illumination module can be fixed to the tube in a simple manner and good heat transfer to the tube can be achieved.

The at least one illumination module can be inserted into a prefabricated tube or be applied on an open support and be reshaped together with the support to form a tube.

It is possible in another configuration that the light sources are arranged in a plurality of rows on the support. As a result, in a tube, for example, the aperture angle of the resulting light beam can be increased. This can be advantageous for example for an illumination device which is configured as a fluorescent tube retrofit lamp.

It is possible in one development that the at least one carrier has a plurality of rows of light sources. It is possible in another development that a plurality of carriers each having a row of light sources are arranged in series with respect to one another.

It is generally possible in one development that the at least one carrier bears by an underside on the support, in particular tube. As a result, the light sources, for example in the case of use in a tube, point into the interior and, consequently, the light emitted by the light sources is emitted into the tube. As a result, it is possible to achieve the advantage that the tube can be used as an optical element (e.g. as a diffusing layer) for the light sources. Moreover, the at least one illumination module is comprehensively protected by the tube.

The tube can completely or partly consist of a light-transmissive material. In one development, the material can be transparent. In another development, the material can be opaque; it is thus possible to improve a homogenization of the light emission from the tube toward the outside.

In another configuration, the illumination device or its lateral surface can have at least one light passage window and otherwise be light-opaque. The light-opaque region can serve as a diaphragm. The material of the light-opaque region can furthermore be optimized toward a high thermal conductivity and/or toward a high strength.

It is possible in one development that the at least one light passage window fixes the illumination module, in particular the at least one carrier, e.g. presses it onto its support. It is thereby possible to achieve particularly reliable fixing of the illumination module to the illumination device without separate fixing means.

It is possible in one alternative configuration that the at least one carrier bears by its top side on the support, in particular tube. As a result, the light sources, for example in the case of use in a tube, face outward and no longer inward into the tube. In order to achieve an areal seating of the carrier and not of the light sources on the support, the light sources project into at least one cutout introduced in the tube. The at least one cutout can be a leadthrough, in particular, whereby direct cooling of the light sources is simplified.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 13 shows an illumination module in accordance with an illumination device of the ninth embodiment in a view from below.

DETAILED DESCRIPTION

The following detailed description refers to the accompanying drawings that show, by way of illustration, specific details and embodiments in which the invention may be practiced.

Figure 1:
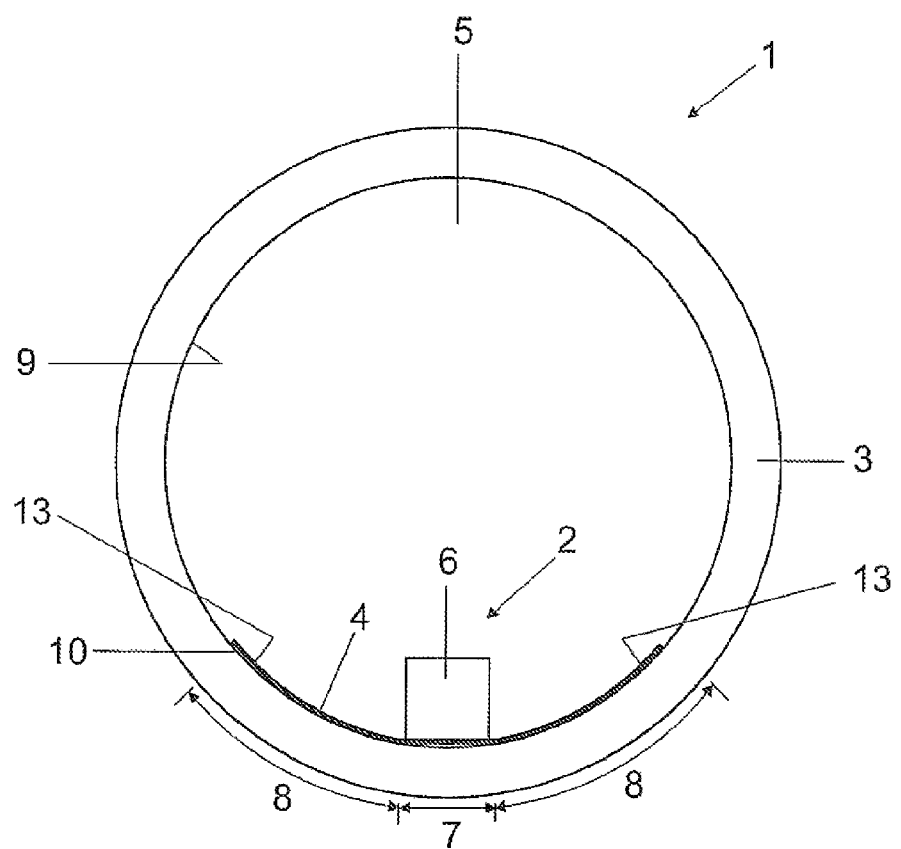
FIG. 1 shows, in front view, an illumination device having an illumination module in accordance with a first embodiment.
Figure 2:
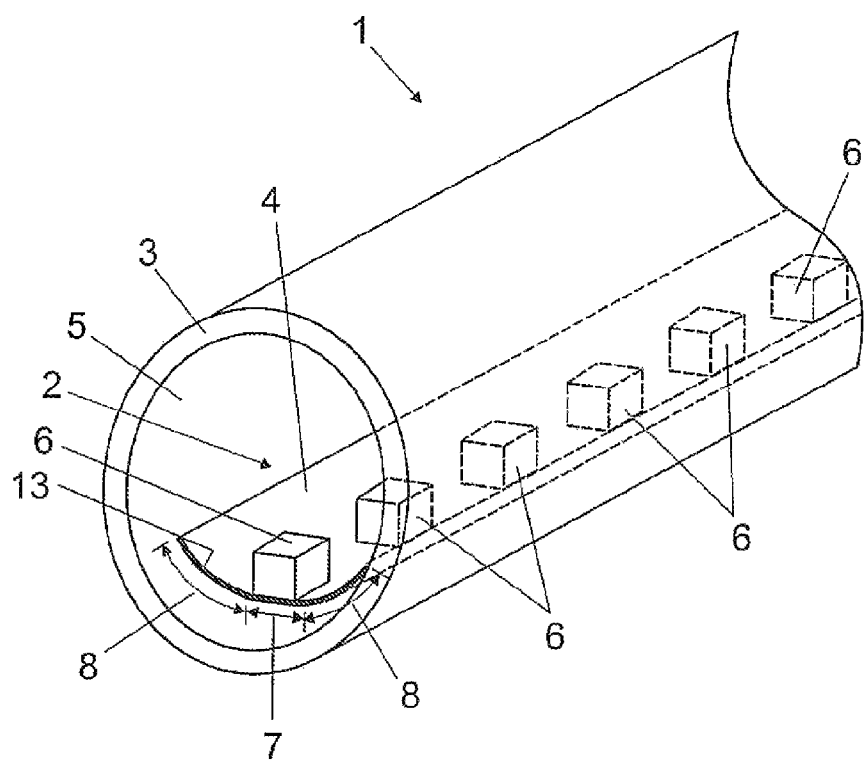
FIG. 2 shows the illumination device in accordance with the first embodiment partially in oblique view.

FIG. 1 shows in front view and FIG. 2 shows in oblique view an illumination device 1 in accordance with a first embodiment. The illumination device 1 has an illumination module 2, which bears on a support in the form of a tube 3. The illumination module 2 has a flexible tape-type carrier 4 for a plurality of heat sources, namely light sources 6 and, if appropriate, electronic components, in the form of light-emitting diodes that emit toward the top into the interior 5 of the tube 3 ("top-LEDs"). The carrier 4 is bent over part of its width in such a way that the carrier 4 does not bend at the central strips 7, which run below the light sources 6 and in a manner projecting somewhat laterally beyond the latter, and is bent at two lateral strips 8 running laterally with respect to the light sources 6. As a result, the illumination module 2 bears with the lateral strips 8 of the carrier 4 areally on a curved inner side 9 of the tube 3 and has a gap between the central strip 7 and the tube 3. The fixing can be achieved by adhesively bonding the lateral strips 8 on the inner side 9 of the tube 3. The lateral strips 8 thus constitute the bearing areas of the carrier 4. At an underside 10 of the respective lateral strip 8, by way of example a respective heat spreading area is situated here, which is formed by a conductor track composed of copper, as will be described in greater detail further below in FIG. 3.

By virtue of the fact that the carrier 4 is not bent in the central strip 7, detachment—possibly caused by a bend—of the light sources 6 or breaking of electrical contacts is prevented. By virtue of the areal bearing on the tube 3, it is possible to achieve good adhesion and large-area heat transfer from the illumination module 2 to the tube 3.

During operation of the illumination module 2, the light emitted by the light sources 6 is emitted into the interior 5 of the tube 3. In the embodiment shown, the tube 3 consists of an electrically insulating and milky-white light-transmissive plastic or glass, such that the light emerges substantially from an upper half of the tube 3 with respect to the illumination module 2 as substantially diffuse light and the illumination module 2 is not or not sharply visible. The illumination device 1 can be used for example as a fluorescent tube retrofit lamp having a directional emission characteristic.

The illumination module 2 can be produced for example analogously to an LED flex tape from the LINEARlight Flex series from Osram, in particular as a quasi endless tape in a roll-to-roll method.

Figure 3:
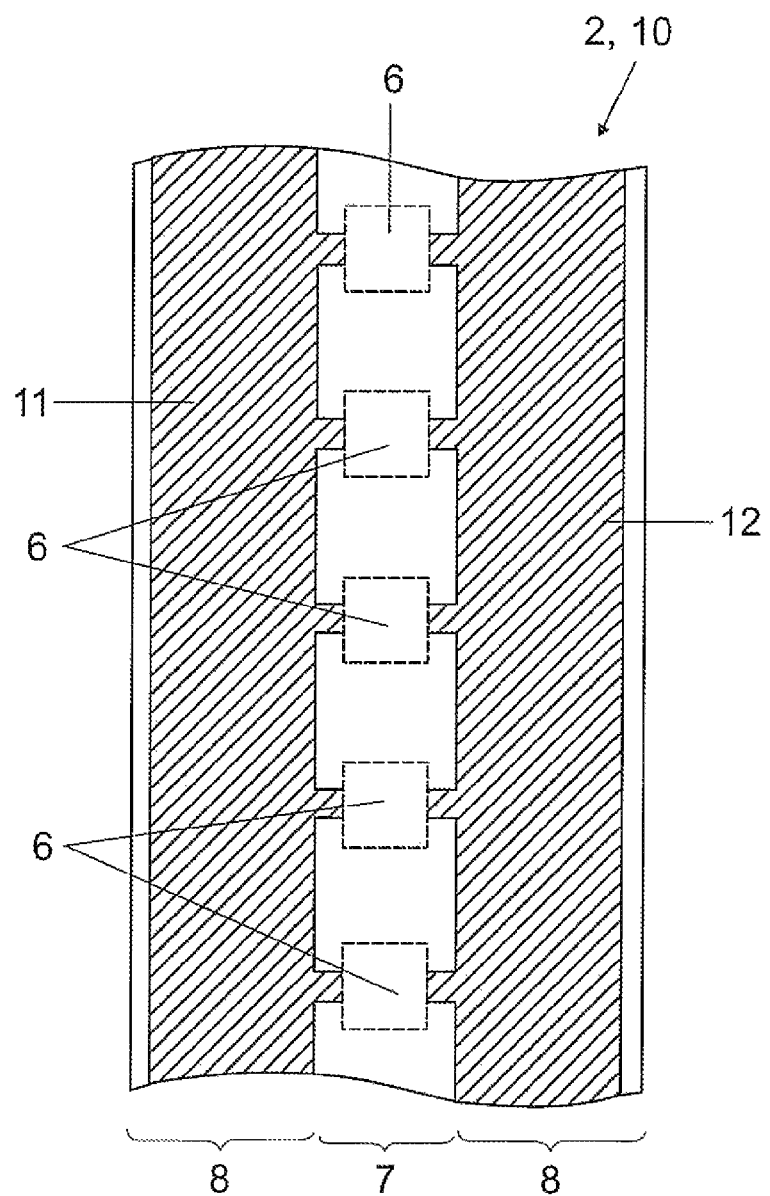
FIG. 3 shows the illumination module in accordance with the illumination device of the first embodiment in a view from below.

FIG. 3 shows the illumination module 2 in a non-bent state from below. The light sources 6 are arranged at the position indicated here by dashed lines at the top side of the carrier 4 and, purely by way of example, are electrically connected in parallel with one another. For this purpose, the light sources 6 are in each case connected to two common electrical lines 11, 12 composed of copper, between which an electrical potential can be applied. Generally, an interconnection of the light sources 6 and, if appropriate, of the other heat sources such as driver units can also be effected in some other way and, for example, also require only one or more than two electrical lines. The electrical lines 11, 12 run substantially at the underside of the carrier 4 at the respective lateral strip 8 and are widened there to almost the full width of the respective lateral strip 8, in order to provide a large thermally conductive bearing area on the tube or some other support. By means of this bearing area, the heat generated by the heat sources of the illumination module 2, including the light sources 6, can be effectively dissipated. Substantially no conductor tracks run in the central strip 7, although generally this is not mandatory.

Figure 4:
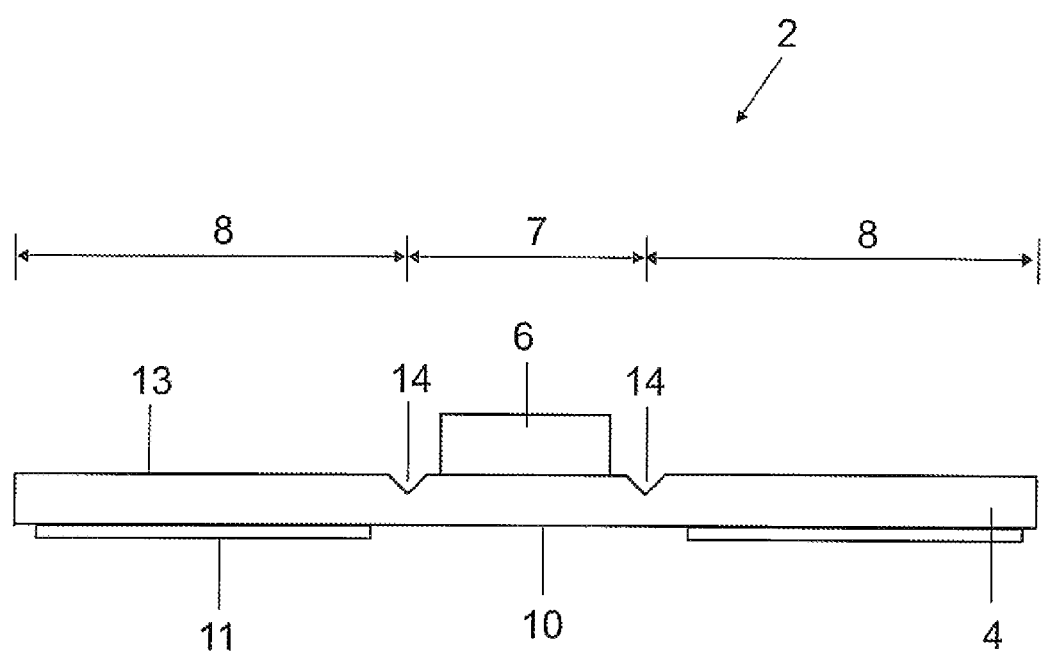
FIG. 4 shows in front view the illumination module in accordance with the illumination device of the first embodiment.

FIG. 4 shows from the front a detail view of the illumination module 2. In order to avoid a bend or curvature of the central strip 7, a top side 13, which also carries the light sources 6, has an expansion joint 14 just laterally alongside the light source 6, said expansion joint extending in the longitudinal direction of the illumination module 2 (here, therefore, perpendicularly to the viewing plane). This prevents a situation in which, when the carrier 4 is placed on the tube, a bend in the lateral strip 8 undergoes transition upward to the central strip 7. Rather, at the expansion joint 14, the lateral strip 8 is angled relative to the central strip 7. By virtue of introduction at that side (here the top side 13) toward which bending takes place, a course of the electrical lines 11, 12 is not obstructed. The expansion joint can run over the entire length of the printed circuit board, or alternatively can be interrupted, in order to make it possible e.g. to realize conductor tracks or heat spreading areas on the surface.

Figure 5:
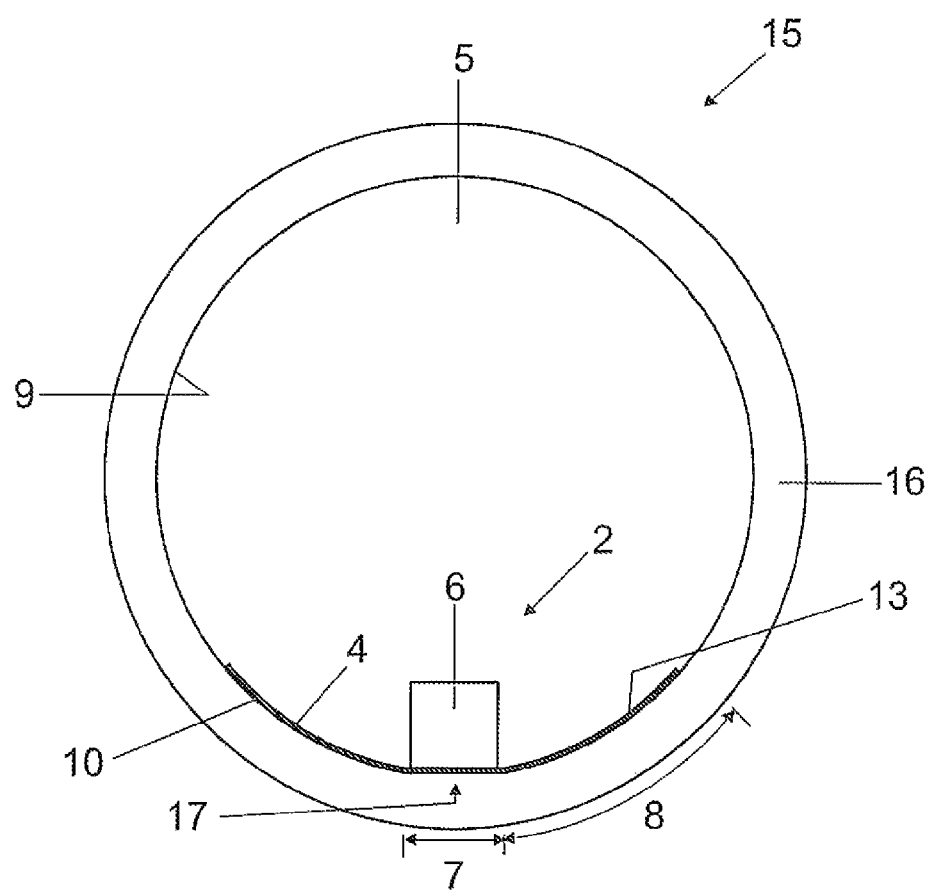
FIG. 5 shows in front view an illumination device in accordance with a second embodiment.

FIG. 5 shows in front view an illumination device 15 in accordance with a second embodiment. This illumination device 15 differs from the illumination device 1 in that the tube 16 has a planar flattened portion 17 onto which the central strip 7 of the illumination module 2 can be placed areally in a matching fashion. As a result, the central strip 7 can also be mechanically and/or thermally linked to the tube 16.

Figure 6:
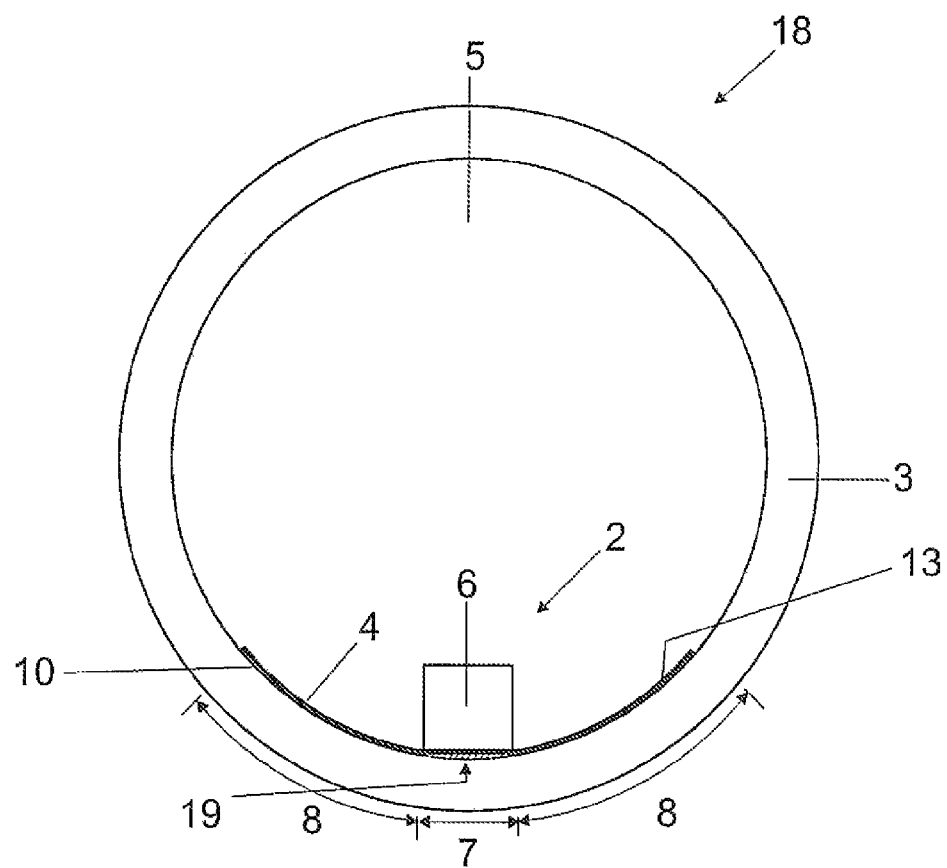
FIG. 6 shows in front view an illumination device in accordance with a third embodiment.

FIG. 6 shows in front view an illumination device 18 in accordance with a third embodiment. In contrast to the illumination device 1 of the first embodiment, the gap between the central strip 7 and the tube 3 is now filled with an at least thermally conductive material 19, e.g. a metal strip or a heat transfer material (TIM; "Thermal Interface Material"). Thus—without adaptation of the tube 3—the central strip 7 can be mechanically and/or thermally linked to the tube 3.

Figure 7:
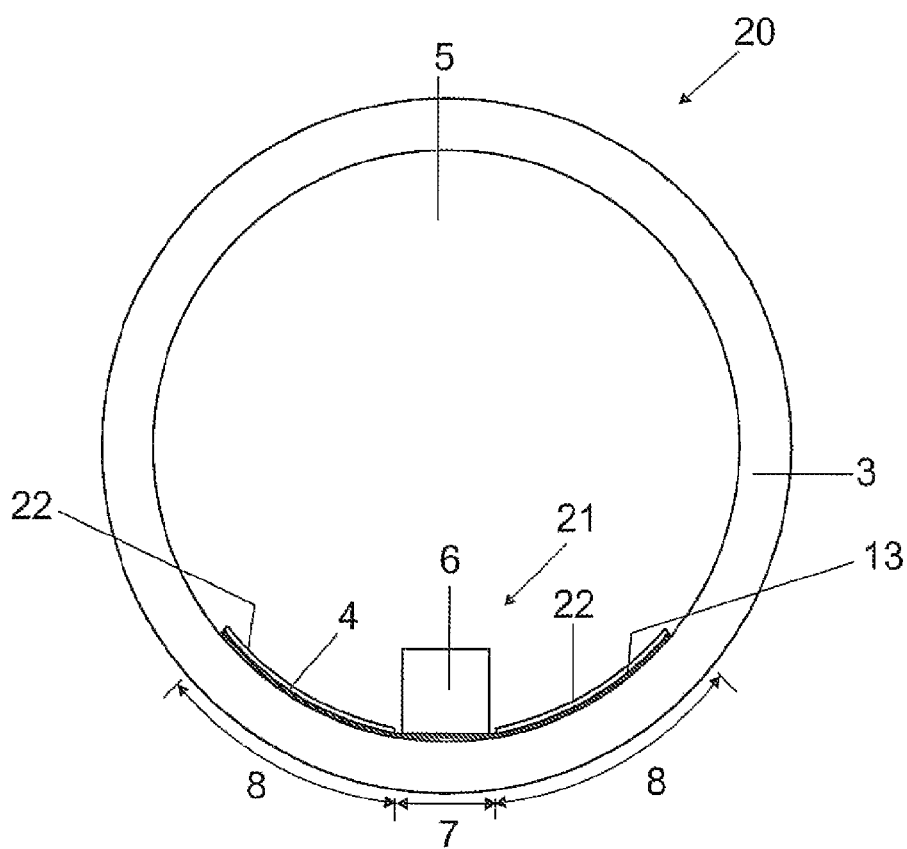
FIG. 7 shows in front view an illumination device in accordance with a fourth embodiment.

FIG. 7 shows in front view an illumination device 20 in accordance with a fourth embodiment having an illumination module 21. In contrast to the embodiments described above, the upwardly curved top side 13 of the lateral strips 8 of the carrier 4, which is also equipped with the light sources 6, is coated with a reflector layer 22, e.g. a specularly reflective aluminum layer or aluminum foil. It is therefore possible to achieve a higher luminous efficiency and/or improved beam guiding, e.g. focusing. Alternatively, a separately produced reflector element can be placed onto the carrier 4. The separately produced reflector element can be for example a metallic reflector or a plastic reflector equipped with a specularly reflective layer, e.g. metallization.

Figure 8:
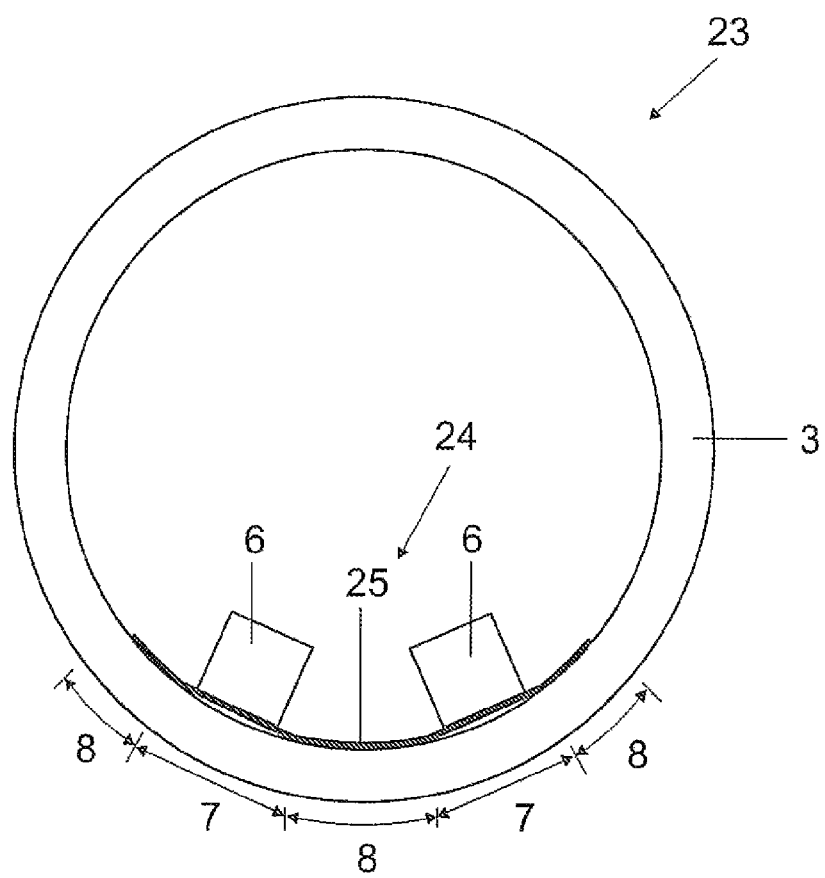
FIG. 8 shows in front view an illumination device in accordance with a fifth embodiment.

FIG. 8 shows in front view an illumination device 23 in accordance with a fifth embodiment. The illumination device 23 has an illumination module 24 having a carrier 25, which has light sources 6 arranged in two longitudinal rows. This gives rise to two central strips 7 below a respective row of the light sources 6 and three lateral strips 8, wherein the middle lateral strip 8 constitutes a "common" lateral strip 8 of the two rows of light sources 6. The illumination device 23 has the advantage that it can generate a higher light intensity than the single-row illumination devices and has a wider emission angle. If, in comparison with a single-row embodiment, importance is not attached to increasing the luminous intensity, but rather to widening the angle of emergence of the light beam, it is also possible to provide an arrangement of the light sources 6 which alternates with respect to the longitudinal direction between the rows. In principle, it is also possible to provide more than two rows of light sources.

Figure 9:
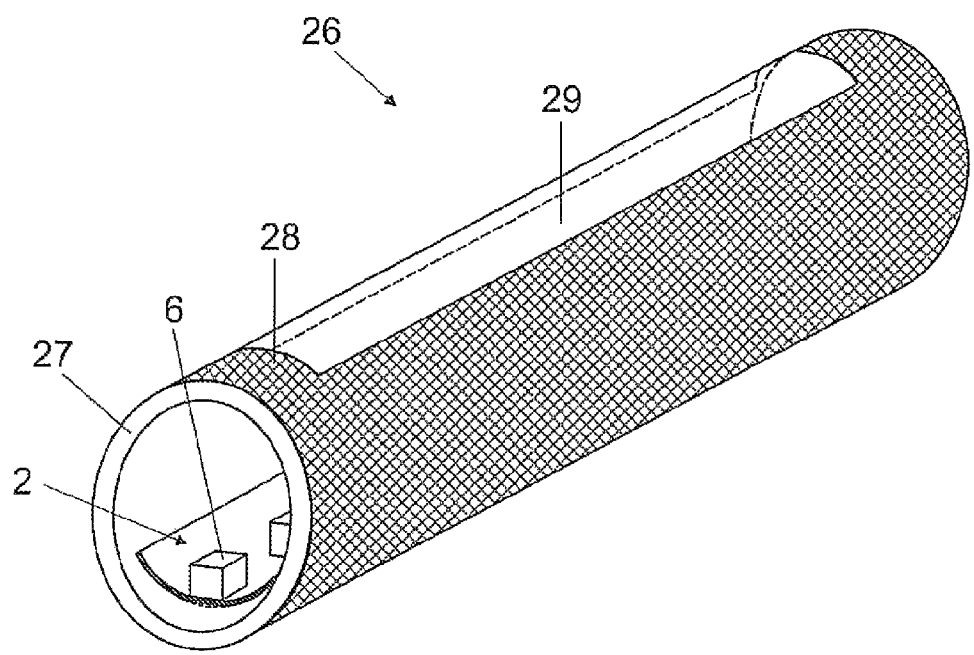
FIG. 9 shows in oblique view an illumination device in accordance with a fifth embodiment.

FIG. 9 shows in oblique view an illumination device 26 in accordance with a fifth embodiment. The illumination device 26 has a tube 27 having a light-opaque basic body 28 and a light-transmissive transparent or opaque light passage window 29 fixed to the basic body 28 directly above the illumination module 2. As a result, the basic body 28 can perform the function of a diaphragm and delimit in a defined fashion a light beam emerging from the illumination device 26. Moreover, the basic body 28 can now consist simply of an inexpensive thermally conductive material, e.g. a metal (steel sheet, aluminum, etc.), and can thus serve as a heat sink. The light passage window 29 can consist for example of a plastic, a glass or a glass ceramic.

Figure 10:
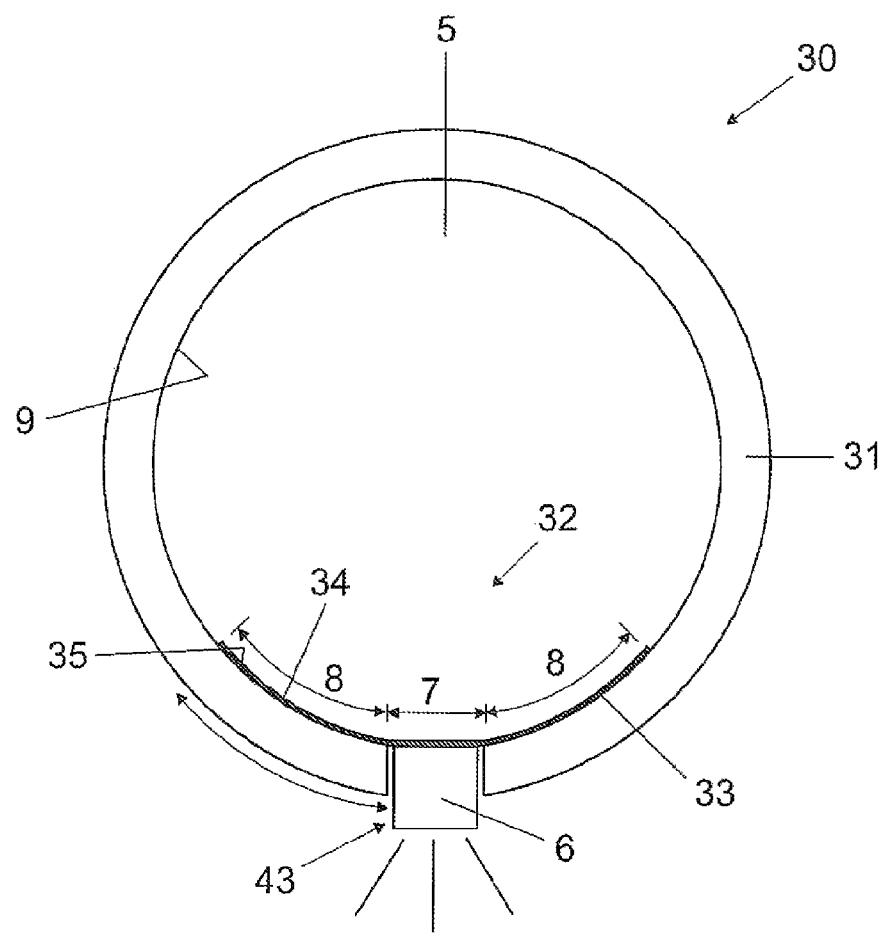
FIG. 10 shows in front view an illumination device in accordance with a sixth embodiment.

FIG. 10 shows in front view an illumination device 30 in accordance with a sixth embodiment. This illumination device 30 has a tube 31 having one or more leadthroughs 43 for leading through the light sources 6. As a result, it is possible for the illumination module 32 to be fixed by its top side, in particular by a top side 33 of a lateral strip 8 of the carrier 34, areally and thermally conductively on the inner side 9 of the tube 31. As a result, the light sources 6 no longer emit into the interior 5 of the tube 31, but rather directly toward the outside. This has the advantage that no absorption or attenuation of the light radiation by the tube 31 takes place.

In this embodiment, the heat spreading areas, e.g. in the form of electrical conductor tracks, can be arranged at the top side 33 of the carrier 34 and possibly present expansion joints or similar thinned portions can be arranged e.g. at the rear side 35.

The above-described illumination modules of the first to sixth embodiments have a tape-type carrier in such a way that its longitudinal extent, which corresponds to the alignment of the light sources, is significantly larger than its transverse extent (extent in the width direction), e.g. more than twice as large.

Figure 11:
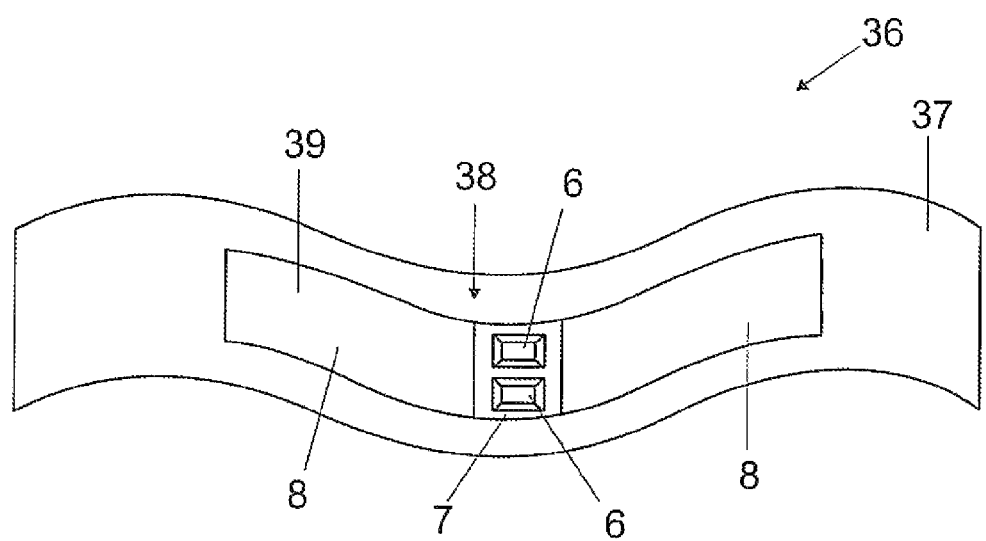
FIG. 11 shows in oblique view an illumination device in accordance with a seventh embodiment.

FIG. 11 shows in oblique view an illumination device 36 in accordance with a seventh embodiment. The support 37, e.g. composed of a metal, for the illumination module 38 is now no longer tubular, but rather curved in a wavy fashion. The illumination module 38 bears on the support 37 in a "wave trough".

In contrast to the above-described illumination modules of the first to sixth embodiments, the illumination module 38 now has a tape-type carrier 39 in such a way that its longitudinal extent, which corresponds to the alignment of the merely two light sources 6, is smaller than its transverse extent. Consequently, a tape-type configuration refers here to an extent of the light sources and/or of the carrier directed at least in sections. Consequently, the width of the lateral strips 8 having the heat spreading areas is much greater here than the width of the central strip 7.

Figure 12:
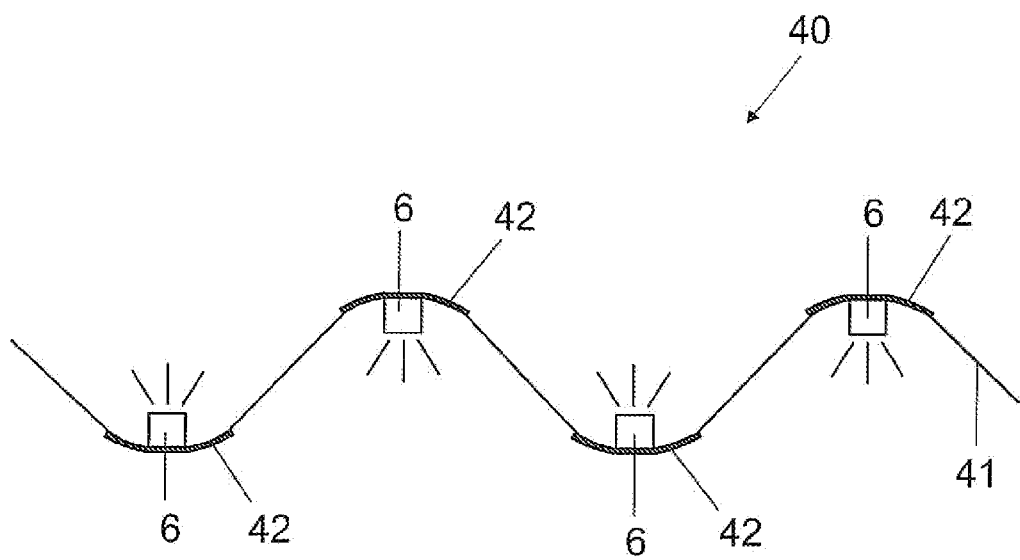
FIG. 12 shows as a sectional illustration an illumination device in accordance with an eighth embodiment.

FIG. 12 shows as a sectional illustration an illumination device 40 in accordance with an eighth embodiment. The illumination device 40 likewise has a wavy support 41, wherein a respective single-row illumination module 42 runs along the wave troughs and wave crests. The illumination modules 42 can be fixed on the support 41 by their underside as shown in the first to fifth embodiments or by their top side as in the sixth embodiment, wherein the support 41 then has at least one leadthrough for the light sources 6. The wavy support 41 is only one example of an arbitrarily shaped support to which an illumination module which is at least partly flexible over its width can be applied.

FIG. 13 shows an illumination module 44 from below, wherein now the two conductor tracks 45, 46 in each case run in a meandering fashion in sections and, moreover, assume a changing width. Thus, the heat spreading area produced by the conductor tracks 45, 46 is kept very large.

It goes without saying that the present invention is not restricted to the exemplary embodiments shown.

Thus, the form of the electrical lines can be chosen freely and can be configured for example in a meandering fashion between two light sources. In the case of more than one electrical line per lateral strip, these can be configured identically or differently, to be precise with regard to their course and/or their size (conductor track width, etc.).

The at least one expansion strip can also be provided for producing pliability or flexibility of a carrier that otherwise is not provided for a bend; for example by introducing a plurality of expansion joints or other local thinned portions.

Moreover, it is possible in one development (not shown) that more than one light passage window is present on a basic body.

It is also possible in one development (not shown) that the at least one light passage window simultaneously fixes the at least one carrier. For this purpose, the light passage window can have suitable projections projecting into the interior of the tube, e.g. rods. The light exit window can also be embodied as an optical element, e.g. as a lens or as a collimator.

Generally, the features of the individual embodiments can be combined; by way of example, an embodiment having at least one reflector and an arrangement of light sources having at least two rows is possible.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

LIST OF REFERENCE SYMBOLS

1 Illumination device
2 Illumination module
3 Tube
4 Carrier
5 Interior
6 Light source
7 Central strip
8 Lateral strip
9 Inner side of the tube
10 Underside of a lateral strip
11 Electrical line
12 Electrical line
13 Top side of a lateral strip
14 Expansion joint
15 Illumination device
16 Tube
17 Flattened portion
18 Illumination device
19 Thermally conductive material
20 Illumination device
21 Illumination module
22 Reflector layer
23 Illumination device
24 Illumination module
25 Carrier
26 Illumination device
27 Tube
28 Basic body
29 Light passage window
30 Illumination device
31 Tube
32 Illumination module
33 Top side
34 Carrier
35 Underside
36 Illumination device
37 Support
38 Illumination module
39 Carrier
40 Illumination device
41 Support
42 Illumination module
43 Leadthrough
44 Illumination module
45 Conductor track
46 Conductor track

The invention claimed is:

1. An illumination module comprising at least one flexible carrier for a plurality of heat sources, including light sources, wherein the carrier is provided for being bent over at least part of its width,
   wherein the carrier is not provided for a bend at a strip running at least below the light sources, and is provided for a bend at at least one strip running laterally with respect to the light sources, and
   wherein the carrier comprises at least one heat spreading area at least on the at least one strip running laterally with respect to the light sources,
   wherein at least part of the at least one heat spreading area is formed by at least one metallic conductor track, and
   wherein substantially the at least one conductor track runs solely in the carrier strip provided for a bend,
   wherein substantially no conductor tracks run in the strip running at least below the light sources,
   wherein the conductor tracks are the electrical connection between at least one first light source of the light sources and at least one second light source of the light sources.

2. The illumination module as claimed in claim 1, wherein the at least one strip provided for a bend comprises at least one bearing area.

3. The illumination module as claimed in claim 1, comprising at least one expansion joint extending along a longitudinal direction of the carrier.

4. The illumination module as claimed in claim 1, comprising at least one reflector.

5. The illumination module as claimed in claim 4, wherein the reflector is present as a separately produced component or the reflector is applied in the form of a mirror layer on the carrier.

6. An illumination device comprising a bent support and at least one illumination module, the at least one illumination module comprising at least one flexible carrier for a plurality of heat sources, wherein the carrier is provided for being bent over at least part of its width, wherein the illumination module is fixed areally to the support at least regionally by a part of the carrier bent widthwise,
   wherein the carrier is not provided for a bend at a strip running at least below the light sources, and is provided for a bend at at least one strip running laterally with respect to the light sources, and
   wherein the carrier comprises at least one heat spreading area at least on the at least one strip running laterally with respect to the light sources,
   wherein the support is embodied in the form of a substantially cylindrical tube and the at least one illumination module is arranged longitudinally in the tube such that the at least one illumination module is at least partly fitted to a curved inner side of the tube,
   wherein substantially no conductor tracks run in the strip running at least below the light sources,
   wherein the conductor tracks are the electrical connection between at least one first light source of the light sources and at least one second light source of the light sources.

7. The illumination device as claimed in claim 6, wherein the light sources are arranged in a plurality of rows.

8. The illumination device as claimed in claim 6, wherein the at least one carrier bears by an underside on the tube.

9. The illumination device as claimed in claim 8, comprising at least one light passage window.

10. The illumination device as claimed in claim 9, wherein the at least one light passage window fixes the at least one carrier.

11. The illumination device as claimed in claim 6, wherein the at least one carrier bears by its top side on the tube and the light sources project into at least one leadthrough introduced in the tube.

12. The illumination module as claimed in claim 1, wherein the at least one carrier is a tape-type carrier.

* * * * *